US010916600B2

United States Patent
Ye

(10) Patent No.: US 10,916,600 B2
(45) Date of Patent: *Feb. 9, 2021

(54) FLEXIBLE TOUCH CONTROL DISPLAY SCREEN AND METHOD FOR MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 15/736,323

(22) PCT Filed: Dec. 12, 2017

(86) PCT No.: PCT/CN2017/115599
§ 371 (c)(1),
(2) Date: Dec. 14, 2017

(87) PCT Pub. No.: WO2019/100455
PCT Pub. Date: May 31, 2019

(65) Prior Publication Data
US 2020/0203437 A1 Jun. 25, 2020

(30) Foreign Application Priority Data

Nov. 22, 2017 (CN) .............................. 2017 1 117083

(51) Int. Cl.
*H01L 27/32* (2006.01)
*G06F 3/041* (2006.01)
(Continued)

(52) U.S. Cl.
CPC .......... *H01L 27/323* (2013.01); *G06F 3/0412* (2013.01); *H01L 27/3244* (2013.01); *H01L 51/0097* (2013.01); *H01L 51/5253* (2013.01); *H01L 51/56* (2013.01); *G06F 2203/04102* (2013.01); *G06F 2203/04103* (2013.01); *H01L 2227/323* (2013.01); *H01L 2251/5338* (2013.01)

(58) Field of Classification Search
CPC ..................................................... H01L 27/323
See application file for complete search history.

(56) References Cited

FOREIGN PATENT DOCUMENTS

JP WO2017006954 * 1/2017

* cited by examiner

*Primary Examiner* — Mohammad M Choudhry
(74) *Attorney, Agent, or Firm* — Soroker Agmon Nordman

(57) ABSTRACT

The present disclosure provides a flexible touch control display screen and a method for manufacturing same. The flexible touch control display screen includes a flexible substrate, a TFT layer, an OLED display layer, and a film encapsulation layer. A metal bridge, a first inorganic layer, a second metal layer, and a protective layer are sequentially formed on the film encapsulation layer. The first inorganic layer includes a plurality of channels formed by patterning the first inorganic layer, as well as a touch control sensing electrode and a touch control driving electrode disposed thereon.

14 Claims, 5 Drawing Sheets

(51) Int. Cl.
*H01L 51/00* (2006.01)
*H01L 51/52* (2006.01)
*H01L 51/56* (2006.01)

FLEXIBLE TOUCH CONTROL DISPLAY SCREEN AND METHOD FOR MANUFACTURING SAME

FIELD OF DISCLOSURE

The present disclosure relates to the field of display panels, and more particularly to a flexible touch control display screen and a method for manufacturing same.

BACKGROUND

Among different types of flat panels, organic light-emitting diode (OLED) displays have outstanding properties, including being light weight, thin, self-illuminating, short response time, wide viewing angles, a wide color gamut, high brightness, and low power consumption. Thus, succeeding liquid crystal displays (LCDs), OLED displays have gradually become a mainstream, next generation display technology. With comparison between OLED displays and LCDs, OLED displays save more energy, are thinner, and have wider viewing angles, to which the LCDs cannot be comparable. Nevertheless, users are getting increasingly unsatisfied with resolution of displayed images, and production of OLED displays with high quality and high resolution still face a lot of challenges.

Current touch control technology can be generally classified to include an out-cell touch control technology and an in-cell touch control technology. The in-cell touch control technology is characterized by integrating touch sensors inside the display panels. Because the in-cell touch control technology, compared to the out-cell touch control technology, enables the display apparatuses to be relatively lighter in weight and is thinner, OLEO display apparatuses manufacturers direct their <attention toward in-cell touch control technology. In contrast, the out-cell touch control technology is characterized by embedding the touch control screen between a color filter substrate and a polarizer of the display screen (i.e., disposing the touch sensors on the liquid crystal display panels), and thus the out-cell touch control technology, when compared to the in-cell touch control technology, would be a better choice to manufacture the display apparatuses.

As development of the display technology keeps improving, researchers have developed foldable or bendable flexible display apparatuses. Compared to the conventional rigid display apparatuses (i.e., display apparatuses which use a non-bendable substrate, such as glass, as a support base plate), the flexible display apparatuses possess many advantages, including being light weight, having a small volume, are easily portable, and having a high impact-resisting ability and a high vibration-resisting ability, Therefore, there are more and more flexible display apparatuses being applied in curved displays, wearable displays, etc. For this reason, the flexible display apparatuses have become mainstream displays in recent years.

With the development of flexible display screens used in OLED displays, the touch control screens being combined with the flexible display screens have to be flexible and pliable as well. However, the conventional touch control screens manufactured based on a transparent conductive film cannot meet the desired flexibility requirement. On the other hand, since the conventional touch control screens have to first be manufactured independently, and then adhered to upper surfaces of the OLED screens via an optical transparent adhesive to form a complete touch control display module, such technology requires an additional bonding step and increases the entire thickness of the module. This is not helpful in achieving the desired flexibility of the touch control display screens.

SUMMARY OF DISCLOSURE

The present disclosure provides a flexible touch control display screen and a method for manufacturing same, which solves the problems existing in the conventional touch control screens that are not flexible and bendable.

To solve the aforementioned problems, the present disclosure provides the following technical schemes.

In a first aspect, the present disclosure provides a method for manufacturing a flexible touch control display screen, comprising:

a step S20 of depositing a first metal layer on a film encapsulation layer, and using a first mask to carry out a first masking process for the first metal layer to form a metal bridge on a surface of the film encapsulation layer;

a step S30 of depositing a first inorganic layer on a surface of the metal bridge, wherein the first inorganic layer covers the metal bridge and the film encapsulation layer;

a step S40 of using a second mask to carry out a second masking process for the first inorganic layer to form at least two recesses and at least two contact holes in the first inorganic layer;

a step S50 of depositing a second metal layer on a surface of the first inorganic layer, and partially removing the second metal layer to form at least two first electrodes and at least one second electrode intersecting with the first electrodes on the first inorganic layer; and a step S60 of depositing a protective layer on a surface of the second metal layer, wherein the protective layer covers the second metal layer and the first inorganic layer.

In accordance with one preferred embodiment of the present disclosure, before the step S20, the method further comprises:

a step S10 of providing a flexible substrate, and sequentially forming a thin film transistor (TFT) layer, an organic light-emitting diode (OLED) display layer, and the film encapsulation layer on the flexible substrate.

In accordance with one preferred embodiment of the present disclosure, the first electrodes disposed in the contact holes include a first sub-electrode; and the first sub-electrode is connected to the metal bridge via the contact holes disposed on the metal bridge.

In accordance with one preferred embodiment of the present disclosure, the second electrode is disposed in the first recess of the first inorganic layer on the metal bridge, and the other portion of the second metal layer excluding a portion of the second metal layer in the first recess constitutes the first electrodes;

a pattern of a touch control electrode formed by intersecting the first electrodes with the second electrode constitutes a metal grid, and the metal grid is diamond-shaped, triangle-shaped, or quadrilateral-shaped; and the first electrode is one of a touch control driving electrode and a touch control sensing electrode, and the second electrode is the other of the touch control driving electrode and the touch control sensing electrode and is different from the first electrode.

In accordance with one preferred embodiment of the present disclosure, the step S50 comprises:

a step S51 of depositing the second metal layer on the surface of the first inorganic layer;

a step S52 of removing part of the second metal layer positioned between each of the contact holes and the first recesses; and a step S53 of forming the first electrodes and the second electrode intersecting with each other on the first inorganic layer.

In a second aspect, the present disclosure provides a flexible touch control display screen comprising a flexible substrate, a thin film transistor (TFT) layer, an organic light-emitting diode (OLED) display layer, and a film encapsulation layer, wherein the flexible touch control display screen further comprises:

a metal bridge disposed on the film encapsulation layer;

a first inorganic layer disposed on the metal bridge, wherein the first inorganic layer covers the metal bridge and the film encapsulation layer, and the first inorganic layer includes at least two recesses and at least two contact holes;

a second metal laser disposed in the recesses and the contact holes, wherein the second metal layer includes a first electrode and a second electrode intersecting with the first electrode; and a protective layer disposed on the first inorganic layer, wherein the protective layer covers the second metal layer and the first inorganic layer.

In accordance with one preferred embodiment of the present disclosure, the recesses include a first recess and a second recess;

the contact holes are disposed above two ends of the metal bridge, the first recess is disposed in the first inorganic layer and above the metal bridge, and the second recess is disposed on the film encapsulation layer; and the first recess is positioned between two of the contact holes, and bottoms and sidewalls of the first recess, the second recess, and the contact holes all include the second metal layer.

In accordance with one preferred embodiment of the present disclosure, the first electrode disposed in the contact holes includes a first sub-electrode; and the first sub-electrode is connected to the metal bridge via the contact holes disposed on the metal bridge.

In accordance with one preferred embodiment of the present disclosure, the second electrode is disposed in the recesses of the first inorganic layer, and the other portion of the second metal layer excluding a portion of the second metal layer in the recesses constitutes the first electrode;

a pattern of a touch control electrode formed by intersecting the first electrode with the second electrode constitutes a metal grid, and the metal grid is diamond-shaped, triangle-shaped, or quadrilateral-shaped; and the first electrode is one of a touch control driving electrode and a touch control sensing electrode, and the second electrode is the other of the touch control driving electrode and the touch control sensing electrode and is different from the first electrode.

In a third aspect, the preset disclosure provides a method for manufacturing a flexible touch control display screen, comprising:

a step S20 of depositing a first metal layer on a film encapsulation layer, and using a first mask to carry out a first masking process for the first metal layer to form a metal bridge on a surface of the film encapsulation layer;

a step S30 of depositing a first inorganic layer on a surface of the metal bridge, wherein the first inorganic layer covers the metal bridge and the film encapsulation layer;

a step S40 of using a second mask to carry out a second masking process for the first inorganic layer to form at least two recesses and at least two contact holes in the first inorganic layer; wherein the recesses include a first recess and a second recess, the contact holes are disposed above two ends of the metal bridge, the first recess is disposed in the first inorganic layer and above the metal bridge, and the second recess is disposed on the film encapsulation layer; and wherein the first recess is positioned between two of the contact holes, and bottoms and sidewalls of the first recess, the second recess, and the contact holes all include the second metal layer;

a step S50 of depositing a second metal layer on a surface of the first inorganic layer, and partially removing the second metal layer to form at least two first electrodes and at least one second electrode intersecting with the first electrodes on the first inorganic layer; and a step S60 of depositing a protective layer an a surface of the second metal layer, wherein the protective layer covers the second metal layer and the first inorganic layer.

In accordance with one preferred embodiment of the present disclosure, before the step S20, the method further comprises:

a step S10 of providing a flexible substrate, and sequentially forming a thin film transistor (TFT) layer, an organic light-emitting diode (OLED) display layer, and the film encapsulation layer on the flexible substrate.

In accordance with one preferred embodiment of the present disclosure, the first electrodes disposed in the contact holes includes a first sub-electrode; and the first sub-electrode is connected to the metal bridge via the contact holes disposed on the metal bridge.

In accordance with one preferred embodiment of the present disclosure, the second electrode is disposed in the first recess of the first inorganic layer on the metal bridge, and the other portion of the second metal layer excluding a portion of the second metal layer in the first recess constitutes the first electrodes;

a pattern of a touch control electrode formed by intersecting the first electrodes with the second electrode constitutes a metal grid, and the metal grid is diamond-shaped, triangle-shaped, or quadrilateral-shaped; and the first electrode is one of a touch control driving electrode and a touch control sensing electrode, and the second electrode is the other of the touch control driving electrode and the touch control sensing electrode and is different from the first electrode.

In accordance with one preferred embodiment of the present disclosure, the step S50 comprises:

a step S51 of depositing the second metal layer on the surface of the first inorganic layer;

a step S52 of removing part of the second metal layer positioned between each of the contact holes and the first recesses; and at step S53 of forming the first electrodes and the second electrode intersecting with each other on the first inorganic layer.

Compared to the conventional technique, present disclosure is characterized in firstly patterning the first inorganic layer disposed on the film encapsulation layer in order to form a plurality of channels in the first inorganic layer, and thereafter forming the metallic touch control sensing electrode in the recesses such that the touch control sensing electrode is integrated in the first inorganic layer. Such technical design can effectively protect the metallic touch control electrode as well as reduce the stress generated when the metallic electrode is bent, thereby preventing the module from breaking under the bent state and achieving the desired flexibility. According to the present disclosure, there is no need to independently manufacture a touch control screen, it is not required to additionally include a bonding step for adhering the touch control screen to the display screen, and the entire thickness of the module is reduced.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
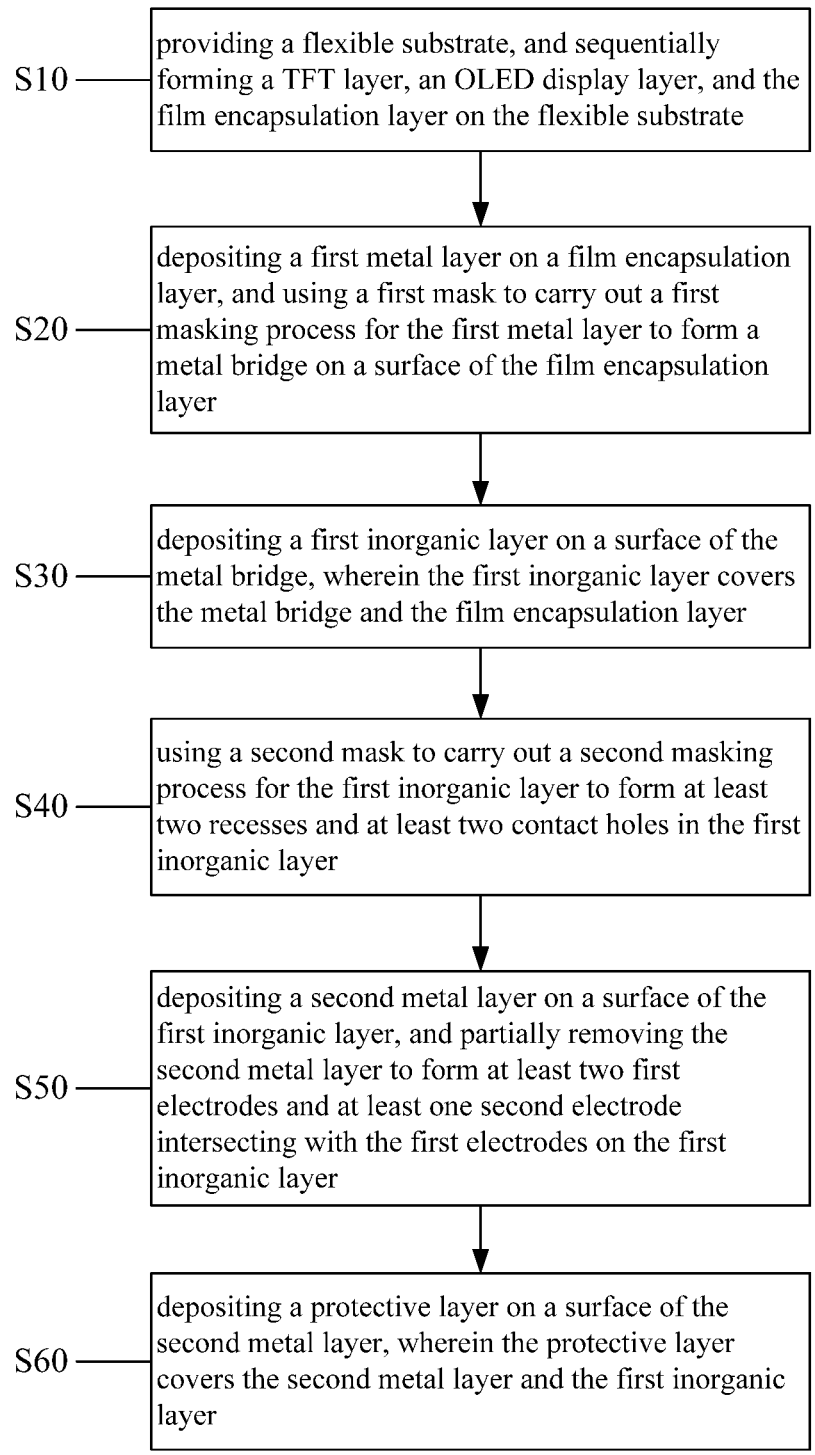
FIG. 1 is a flowchart showing a method for manufacturing a flexible touch control display screen according to one preferred embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure solves the problems existing in the conventional flexible displays, where the conventional touch control screens manufactured based on a transparent conductive film cannot meet the desired flexibility requirement, and the technology using the out-cell touch control screens requires an additional bonding step and increases the entire thickness of the module, which is not helpful in achieving the desired flexibility of touch control display screens.

FIG. 1 is a flowchart showing a method for manufacturing a flexible touch control display screen according to one preferred embodiment of the present disclosure. The method includes the following steps.

In a step S10, a flexible substrate 101 is provided; and a thin film transistor (TFT) layer 102, an organic light-emitting diode (OLED) display layer 103, and a film encapsulation layer 104 are sequentially formed on the flexible substrate 101.

Figure 2:
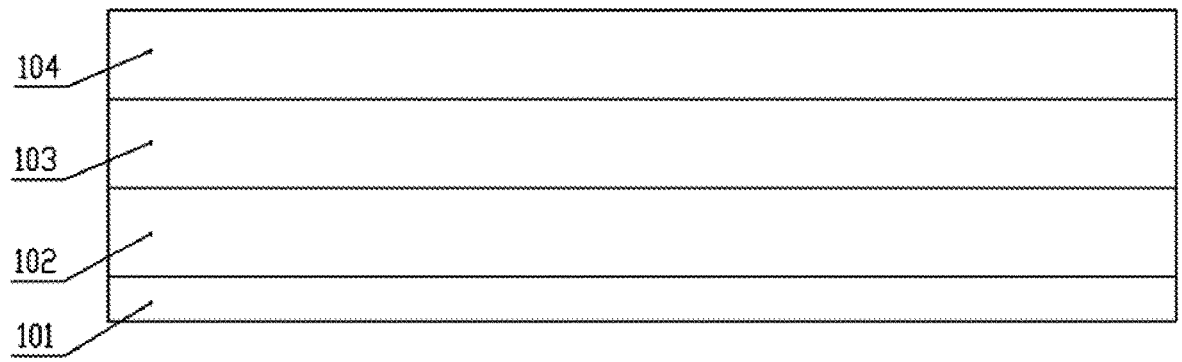
FIGS. 2, 3A-3B, and 4-8 show a process flow of a method for manufacturing a flexible touch control display screen according to one preferred embodiment of the present disclosure.

Specifically, as shown in FIG. 2, a flexible substrate 101 is provided first. The flexible substrate 101 is a polyimide (PI) film, and is used as a base plate of the flexible display panel.

The PI film is made of PI which is one of the best insulating materials in the world, and has high tensile strength. The PI film is formed by condensation polymerization of pyromellitic dianhydride and diaminodiphenyl ether in a strong polar solvent, which is then casted to form a film and is further imidized.

Next, a TFT layer 102, an OLED display layer 103, and a film encapsulation layer 104 are sequentially formed on the flexible substrate 101. The TFT layer 102 includes a buffer layer, an active layer, a gate insulation layer, a gate layer, an inter-insulation layer, a source/drain layer, and a planarization layer.

The OLED display layer 103 includes an anode layer, a pixel defining layer, a first common layer, a light-emitting layer, a second common layer, and a cathode layer.

The anode layer is formed on the TFT layer 102. The anode layer is mainly configured for providing holes used for receiving electrons, and the anode layer is transparent to allow light emitted to pass therethrough. The pixel defining layer is formed on the TFT layer 102. The first common layer is formed on the pixel defining layer. The first common layer completely covers the pixel defining layer and the anode layer. The first common layer is used for injection of holes and transport of holes. As such, the first common layer could be named a hole transport function layer. The light-emitting layer is formed on the first common layer. The light-emitting layer is made of an organic semiconductor material which has a special energy band structure capable of emitting photons with certain wavelength after receiving electrons from the anode. The photons entering our eyes form the colors that we see. The second common layer is formed on the first common layer. The second common layer completely covers the light-emitting layer and the first common layer. The second common layer is used for the injection of electrons and the transport of electrons. As such, the second common layer could be named an electron transport function layer. The cathode layer is formed on the second common layer. The cathode layer is generally made of an alloy having low work function and generates electrodes under a given voltage.

The film encapsulation layer 104 is mainly functioned to block water and oxygen, in order to prevent the organic light-emitting layer from being eroded by external moisture. Typically, the film encapsulation layer 104 is composed of an organic encapsulation layer and two inorganic encapsulation layers stacked on each other, Preferably, the organic encapsulation layer is positioned in middle of the film encapsulation layer 104, and the inorganic encapsulation layers are disposed at two sides of the film encapsulation layer 104 and enclose the organic encapsulation layer.

Though the organic encapsulation layer has excellent flexibility, its ability to block water and oxygen from passing therethrough is limited. On the other hand, though the dense pinhole-free inorganic encapsulation layer has better ability to block water and oxygen from passing therethrough, it is difficult to form a dense film with high quality if its thickness exceeds a certain value, and thus the film property of the inorganic encapsulation layer is usually rigid and fragile. Accordingly, most of the flexible encapsulation materials used currently in this technical field have a multi-layer structure including both organic and inorganic films that are alternated with each other.

In a step 20, a first metal layer is deposited on a film encapsulation layer 104, and a first mask is used to carry out a first masking process for the first metal layer to form a metal bridge on a surface of the film encapsulation layer 104.

Figure 3A:
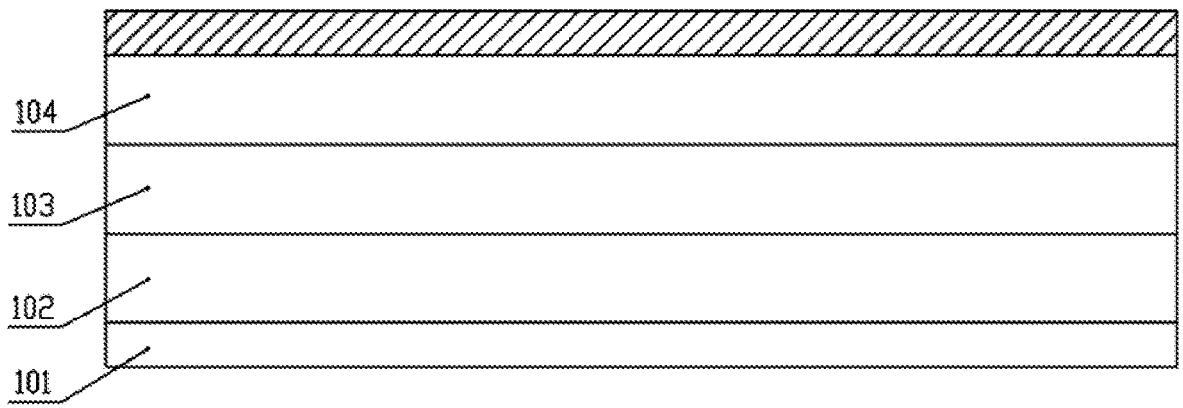

Specifically, as shown in FIG. 3A, a first metal layer is deposited on a film encapsulation layer 104 first. In the present embodiment, the first metal layer can be made of a metal such as titanium, aluminum, silver, or copper. Alternatively, the first metal layer can have a multi-layer structure including films made of die above described metals.

Figure 3B:
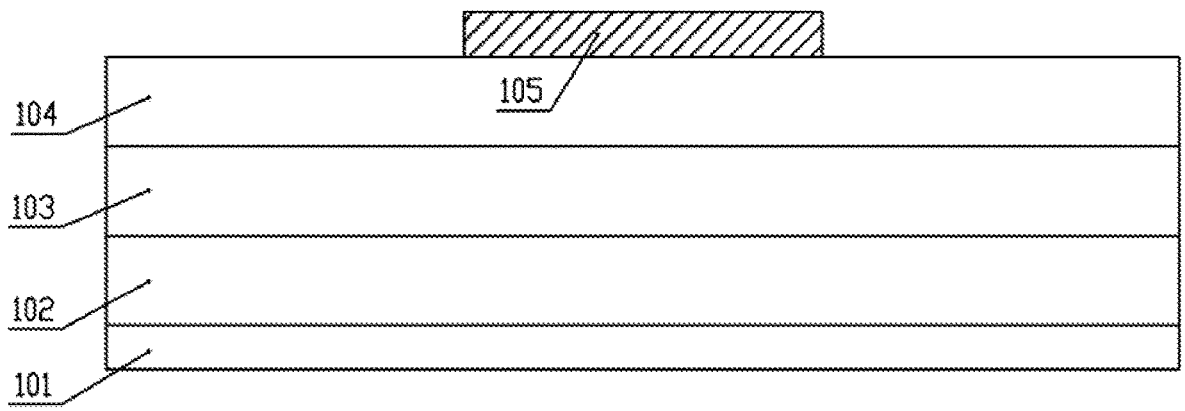

Next, a photoresist layer is coated on the first metal layer. Then, a mask is used to perform exposure, development, etching, and stripping in order to pattern the photoresist layer. In this way, a metal bridge 105 is thrilled on the film encapsulation layer 104, as shown in FIG. 3B.

In a step S30, a first inorganic layer 106 is deposited on a surface of the metal bridge 105, such that the first inorganic layer covers the metal bridge 105 and the film encapsulation layer 104.

Figure 4:
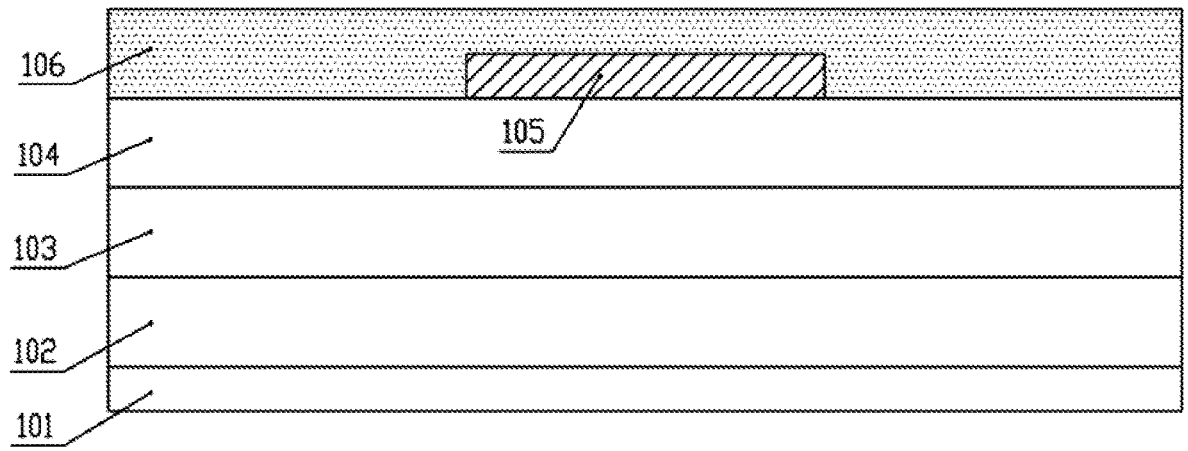

Specifically, as shown in FIG. 4, a first inorganic layer 106 is deposited on a surface of the metal bridge 105. The first inorganic layer 106 is generally made of an inorganic material such as silicon oxide, silicon nitride, silicon oxynitride, aluminum oxide, or zirconium dioxide.

In case that the inorganic layer is made of silicon oxide, silicon nitride, or silicon oxynitride, the first inorganic layer can be formed by plasma enhanced chemical vapor deposition. In case that the inorganic layer is made of aluminum oxide or zirconium dioxide, the first inorganic layer can be formed by atomic layer deposition.

Atomic layer deposition is a layer-by-layer deposition method that deposits a plurality of single atomic layers on a surface of a substrate. During atomic layer deposition, formation of a new atomic layer is chemically related to a previously deposited atomic layer. Such a technique results in deposition of atomic layers one at a time in each reaction. Since each deposition cycle is self-limiting, it is easy to precisely control the thickness of the deposited thin film by controlling the number of reaction cycles.

In a step S40, a second mask is used to carry out a second masking process for the first inorganic layer 106 to form at least two recesses and at least two contact holes in the first inorganic layer 106.

Figure 5:
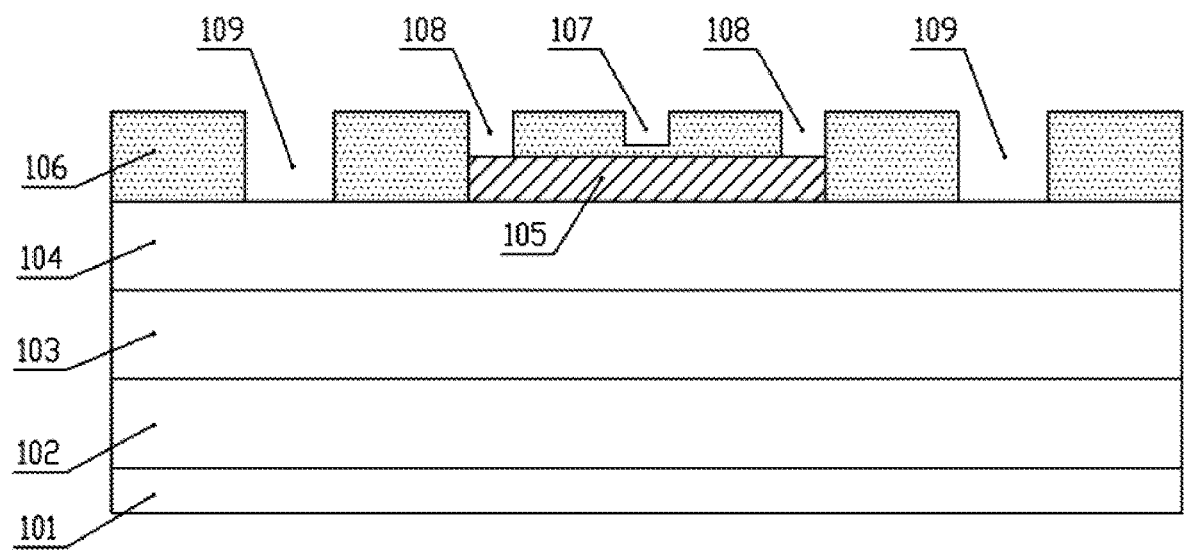

Specifically, as shown in FIG. 5, a photoresist layer is coated on the first inorganic layer 106. Then, a mask is used to perform exposure, development, etching, and stripping in order to pattern the photoresist layer. In this way, at least two recesses and at least two contact holes are formed in the first inorganic layer 106.

The recesses include a first recess 108 and a second recess 109.

The contact holes 107 are disposed above two ends of the metal bridge 105. The second recess 109 is disposed on the film encapsulation layer 104. The first recess 108 is disposed in the first inorganic layer 106 and above the metal bridge 105. Moreover, the first recess 108 is positioned between two of the contact holes 107.

Preferably, the first recess 108 and the contact holes have a cross-section that is rectangle-shaped, V-shaped, or arc-shaped. In the present embodiment, the cross-section of the first recess 108 and the contact holes are rectangle-shaped.

In a step S50, a second metal layer is deposited on a surface of the first inorganic layer, and partially removing the second metal layer to form a first electrode and a second electrode intersecting with the first electrode on the first inorganic layer.

Figure 6:
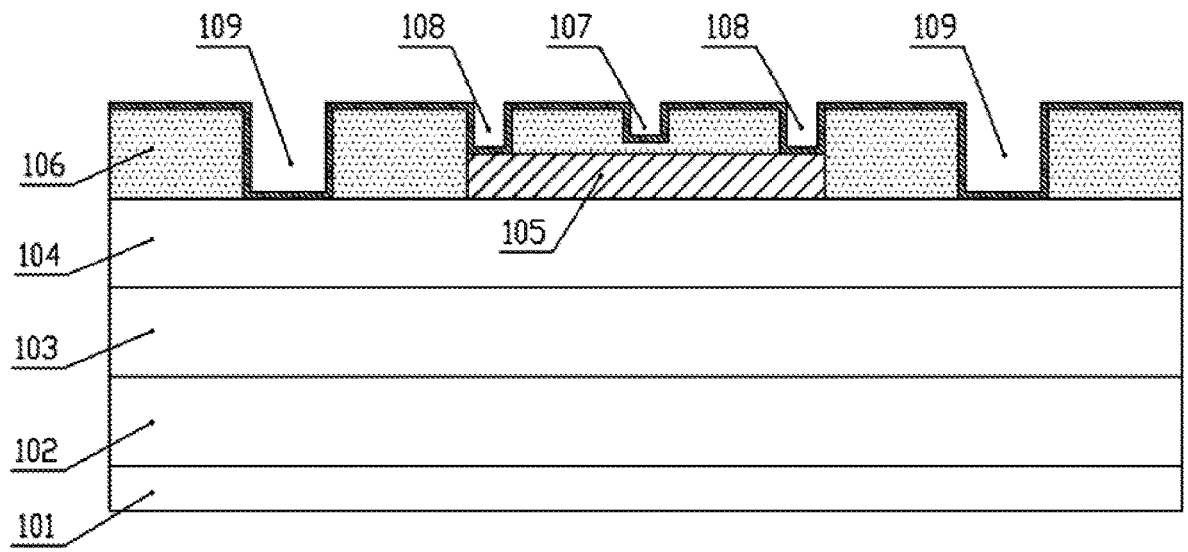
Figure 7:
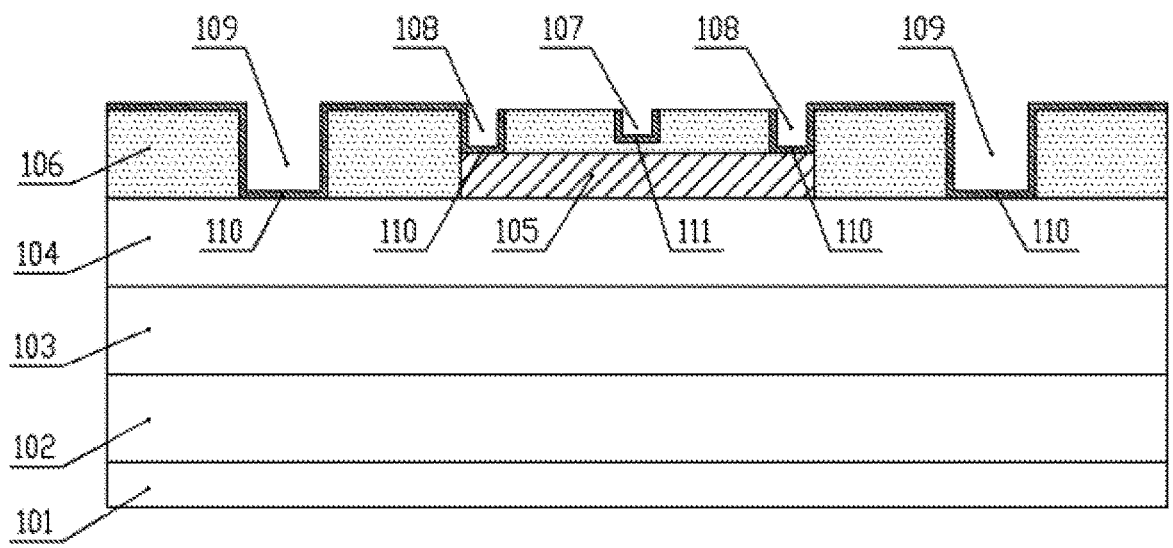

Specifically, as shown in FIG. 6 and FIG. 7, a second metal layer is deposited on a surface of the first inorganic layer 106 by sputtering or vapor deposition first, and then a photolithograph process is used to remove part of the second metal layer disposed between each of the contact holes 107 and the first recess 108, so as to form a touch control electrode. The touch control electrode includes a first electrode 110 and a second electrode 111.

Bottoms and sidewalls of the first recess 108, the second recess 109 and the contact holes 107 all include the second metal layer.

The second electrode 111 is disposed in the first recess 108 of the first inorganic layer 106 on the metal bridge. And, the other portion of the second metal layer excluding a portion of the second metal layer in the first recess 108 constitutes the first electrode 110.

The first electrode 110 is one of a touch control driving electrode and a touch control sensing electrode, and the second electrode 111 is the other of the touch control driving electrode and the touch control sensing electrode. In the present embodiment, the first electrode 110 is a touch control driving electrode while the second electrode 111 is a touch control sensing electrode.

The first electrode 110 disposed in the contact holes 107 includes a first sub-electrode. The first sub-electrode is connected to the metal bridge 105 via the contact holes 107 disposed on the metal bridge 105, so as to establish an electrical connection with the touch control driving electrode and an electrical connection with the touch control sensing electrode.

In addition, a pattern of a touch control electrode formed by intersecting the first electrode 110 with the second electrode 111 constitutes a metal grid, and the metal grid is diamond-shaped, triangle-shaped, or quadrilateral-shaped.

In a step S60, a protective layer 112 is deposited on a surface of the second metal layer such that the protective layer 112 covers the second metal layer and the first inorganic layer 106.

Figure 8:
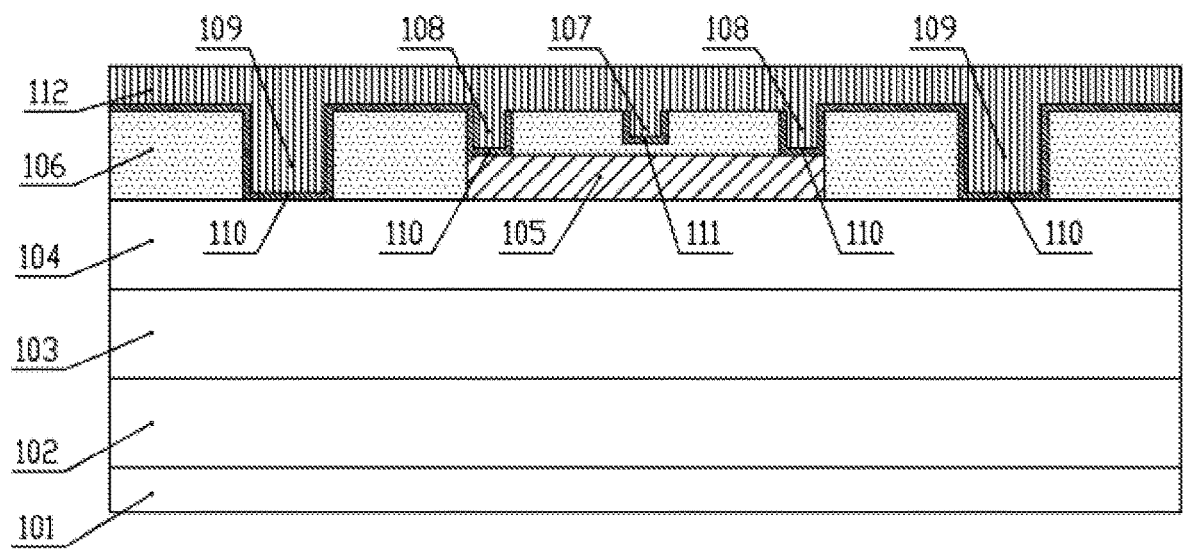

Specifically, as shown in FIG. 8, a protective layer 112 is deposited on a surface of the second metal layer. The protective layer 112 is used to protect the touch control electrode.

The protective layer 112 is generally formed by plasma enhanced chemical vapor deposition. Plasma enhanced chemical vapor deposition is a deposition method which provides energy to substances and excites substances to an ionized state, so as to trigger a series of chemical reactions for forming a film. Plasma enhanced chemical vapor deposition enables deposition at low temperature, and forms films that have excellent quality without pinholes and would be difficult to crack.

Typically, the protective layer 112 is made of an organic material such as $SiO_xC_yH_z$, $SiN_xC_yH_z$, or $SiO_xN_yC_zH_m$.

The present embodiment forms the touch control sensing electrode by integrating same in the first inorganic layer 106 where the first inorganic layer 106 is disposed above the film encapsulation layer 104. This could not only protect the metallic touch control electrode but reduce the stress generated when the metallic electrode is bent, preventing the module from breaking under the bended state as well as achieving the desired flexibility.

Figure 9:
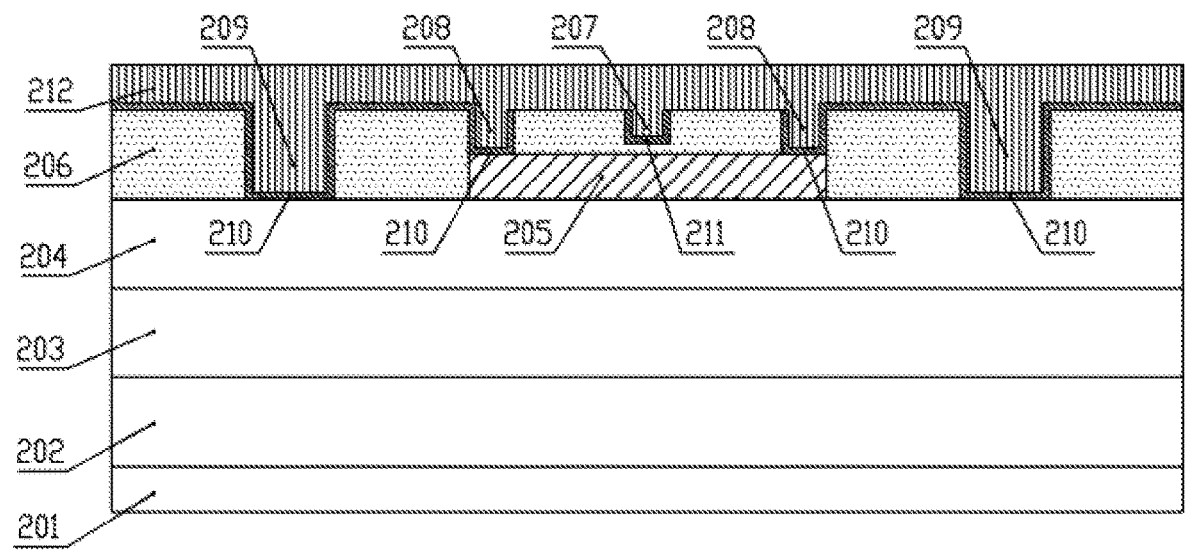
FIG. 9 is a schematic diagram showing a cross-sectional view of a flexible touch control display screen according to one preferred embodiment of the present disclosure.

FIG. 9 is a schematic diagram showing a cross-sectional view of a flexible touch control display screen according to one preferred embodiment of the present disclosure. The flexible touch control display screen includes a flexible substrate 201, a thin film transistor (TFT) layer 202, an organic light-emitting diode (OLED) display layer 203, and a film encapsulation layer 204.

The flexible substrate 201 is a polyimide (PI) film, and is used as a base plate of the flexible display panel.

The PI film is made of PI which is one of the best insulating materials in the world, and has high tensile strength. The PI film is formed by condensation polymerization of pyromellitic dianhydride and diaminodiphenyl ether in a strong polar solvent, which is then casted to form a film and is further imidized.

The TFT layer 202, the OLED display layer 103, and the film encapsulation layer 104 are sequentially formed on the flexible substrate 201. The TFT layer 202 includes a buffer layer, an active layer, a gate insulation layer, a gate layer, an inter-insulation layer, a source/drain layer, and a planarization layer.

The OLED display layer 203 includes an anode layer, a pixel defining layer, a first common layer, a light-emitting layer, a second common layer, and a cathode layer.

The film encapsulation layer 204 is mainly functioned to block water and oxygen, in order to prevent the organic light-emitting layer from being eroded by external moisture. Typically, the film encapsulation layer 204 is composed of an organic encapsulation layer and two inorganic encapsulation layers stacked on each other. Preferably, the organic encapsulation layer is positioned in middle of the film encapsulation layer 204, and the inorganic encapsulation layers are disposed at two sides of the film encapsulation layer 204 and enclose the organic encapsulation layer.

Though the organic encapsulation layer has excellent flexibility, its ability to block water and oxygen from passing therethrough is limited. On the other hand, though the dense pinhole-free inorganic encapsulation layer has better ability to block water and oxygen from passing therethrough, it is difficult to form a high quality dense film if its thickness exceeds a certain value, and thus the film property of the inorganic encapsulation layer is usually rigid and fragile. Accordingly, most of the flexible encapsulation materials used currently in this technical field have a multi-layer structure including both organic and inorganic films that are alternated with each other.

The flexible touch control display screen further includes a metal bridge 205, a first inorganic layer 206, a second metal layer, and a protective layer 212.

The metal bridge 205 is formed on the film encapsulation layer 204. Specifically, a first metal layer is deposited on the film encapsulation layer 204 first. Next, a photoresist layer is coated on the first metal layer. Then, a mask is used to perform exposure, development, etching, and stripping in order to pattern the photoresist layer. In this way, a metal bridge 205 is formed on the film encapsulation layer 204.

In this embodiment, the first metal layer can be made of a metal such as titanium, aluminum, silver, or copper. Alternatively, the first metal layer can have a multi-layer structure including films made of the above described metals.

The first inorganic layer 206 is formed on the metal bridge 205, and covers the metal bridge 205 and the film encapsulation layer 204. The first inorganic layer 206 is generally made of an inorganic material such as silicon oxide, silicon nitride, silicon oxynitride, aluminum oxide, or zirconium dioxide.

In the case that the inorganic layer is made of silicon oxide, silicon nitride, or silicon oxynitride, the first inorganic layer can be formed by plasma enhanced chemical vapor deposition. In the case that the inorganic layer is made of aluminum oxide or zirconium dioxide, the first inorganic layer can be formed by atomic layer deposition.

Atomic layer deposition is a layer-by-layer deposition method that deposits a plurality of single atomic layers on a surface of a substrate. During atomic layer deposition, formation of a new atomic layer is chemically related to a previously deposited atomic layer. Such technique results in deposition of atomic layers one at a time in each reaction. Since each deposition cycle is self-limiting, it is easy to precisely control the thickness of the deposited thin film by controlling number of reaction cycles.

The first inorganic layer 206 includes at least two recesses and at least two contact holes 207.

The contact holes 207 are disposed above two ends or the metal bridge 205. The second recess 209 is disposed on the film encapsulation layer 204. The first recess 208 is disposed in the first inorganic layer 206 and above the metal bridge 205. Moreover, the first recess 208 is positioned between two of the contact holes 207.

Preferably, the first recess 208 and the contact holes have a cross-section that is rectangle-shaped, V-shaped, or arc-shaped. In the present embodiment, the cross-section of the first recess 208 and the contact holes are rectangle-shaped.

The second metal layer is formed in the first recess 208 and the contact holes. Specifically, a second metal layer is deposited on a surface of the first inorganic layer 206 by sputtering or vapor deposition first, and then a photolithograph process is used to remove part of the second metal layer disposed between each of the contact holes 207 and the first recess 208. Bottoms and sidewalls of the first recess 208, the second recess 209 and the contact holes 207 all include the second metal layer.

Additionally, the second metal layer includes a first electrode 210 and a second electrode 211.

The second electrode 211 is disposed in the first recess 208 of the first inorganic layer 206 on the metal bridge. The other portion of the second metal layer excluding a portion of the second metal layer in the first recess 208 constitutes the first electrode 210.

The first electrode 210 is one of a touch control driving electrode and a touch control sensing electrode, and the second electrode 211 is the other of the touch control driving electrode and the touch control sensing electrode. In the present embodiment, the first electrode 210 is a touch control driving electrode while the second electrode 211 is a touch control sensing electrode.

The first electrode 210 disposed in the contact holes 207 includes a first sub-electrode. The first sub-electrode is connected to the metal bridge 205 via the contact holes 207 disposed on the metal bridge 205, so as to establish an electrical connection to the touch control driving electrode and an electrical connection to the touch control sensing electrode.

In addition, a pattern of a touch control electrode formed by intersecting the first electrode 210 with the second electrode 211 constitutes a metal grid, and the metal grid is diamond-shaped, triangle-shaped, or quadrilateral-shaped.

The protective layer 212 is formed on the first inorganic layer 206, such that the protective layer 212 covers the second metal layer, and the first inorganic layer 206. The protective layer 212 is used to protect the touch control electrode.

The protective layer 212 is generally formed by plasma enhanced chemical vapor deposition. Plasma enhanced chemical vapor deposition is a deposition method which provides energy to species and excites species to an ionized state, so as to trigger a series of chemical reactions for forming a film. Plasma enhanced chemical vapor deposition enables deposition at low temperature, and forms films that have excellent quality without pinholes and would be difficult to crack.

Typically, the protective layer 212 is made of an organic material such as $SiO_xC_yH_z$, $SiN_xC_yH_z$, or $SiO_xN_yC_zH_m$.

The present disclosure provides a flexible touch control display screen and a method for manufacturing same. The flexible touch control display screen includes a flexible substrate, a TFT layer, an OLED display layer, and a film encapsulation layer. A metal bridge, a first inorganic layer, a second metal layer, and a protective layer are sequentially formed on the film encapsulation layer. The present disclosure is characterized in firstly patterning the first inorganic layer disposed on the film encapsulation layer in order to form a plurality of channels in the first inorganic layer, and thereafter forming the metallic touch control sensing electrode in the recesses such that the touch control sensing electrode is integrated in the first inorganic layer. Such a technical design can effectively protect the metallic touch control electrode as well as reduce the stress generated when the metallic electrode is bent, thereby preventing the module from breaking under the bent state and achieving the desired flexibility. According to the present disclosure, there is no need to independently manufacture a touch control screen, it is not required to additionally include a bonding step for adhering the touch control screen to the display screen, and the entire thickness of the module is reduced.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a flexible touch control display screen, comprising:
    a step S20 of depositing a first metal layer on a film encapsulation layer, and using a first mask to carry out a first masking process for the first metal layer to form a metal bridge on a Surface or the film encapsulation layer;
    a step S30 of depositing a first inorganic layer on a surface of the metal bridge, wherein the first inorganic layer covers the metal bridge and the film encapsulation layer;
    a step S40 of using a second mask to carry out a second masking process for the first inorganic layer to form at least two recesses and at least two contact holes in the first inorganic layer;
    a step S50 of depositing a second metal layer on a surface of the first inorganic layer, and partially removing the second metal layer to form at least two first electrodes and at least one second electrode intersecting with the first electrodes on the first inorganic layer; and
    a step S60 of depositing a protective layer on a surface of the second metal layer, wherein the protective layer covers the second metal layer and the first inorganic layer.

2. The method according to claim 1, wherein, before the step S20, the method further comprises:
    a step S10 of providing a flexible substrate, and sequentially forming a thin film transistor (TFT) layer, an organic light-emitting diode (OLED) display layer, and the film encapsulation layer on the flexible substrate.

3. The method according to claim 1, wherein the first electrodes disposed in the contact holes includes a first sub-electrode; and
    wherein the first sub-electrode is connected to the metal bridge via the contact holes disposed on the metal bridge.

4. The method according, to claim 1, wherein the second electrode is disposed in the first recess of the first inorganic layer on the metal bridge, and the other portion of the second metal layer excluding a portion of the second metal layer in the first recess constitutes the first electrodes;
    wherein a pattern of a touch control electrode formed by intersecting the first electrodes with the second electrode constitutes a metal grid, and the metal grid is diamond-shaped, triangle-shaped, or quadrilateral-shaped; and
    wherein the first electrode is one of a touch control driving electrode and a touch control sensing electrode, and the second electrode is the other of the touch control driving electrode and the touch control sensing electrode and is different from the first electrode.

5. The method according to claim 1, wherein the step S50 comprises:
    a step S51 of depositing the second metal layer on the surface of the first inorganic layer;
    a step S52 of removing part of the second metal layer positioned between each of the contact holes and the first recesses; and
    a step S53 of forming the first electrodes and the second electrode intersecting with each other on the first inorganic layer.

6. A flexible touch control display screen comprising a flexible substrate, a thin film transistor (TFT) layer, an organic light-emitting diode (OLED) display layer, and a film encapsulation layer, wherein the flexible touch control display screen further comprises:
    a metal bridge disposed on the film encapsulation layer;
    a first inorganic layer disposed on the metal bridge, wherein the first inorganic layer covers the metal bridge and the film encapsulation layer, and the first inorganic layer includes at least two recesses and at least two contact holes;
    a second metal layer disposed in the recesses and the contact holes, wherein the second metal layer includes a first electrode and a second electrode intersecting with the first electrode; and
    a protective layer disposed on the first inorganic layer, wherein the protective layer covers the second metal layer and the first inorganic layer.

7. The flexible touch control display screen according to claim 6, wherein the recesses include a first recess and a second recess;
    wherein the contact holes are disposed above two ends of the metal bridge, the first recess is disposed in the first inorganic layer and above the metal bridge, and the second recess is disposed on the film encapsulation layer; and
    wherein the first recess is positioned between two of the contact holes, and bottoms and sidewalk of the first recess, the second recess and the contact holes all include the second metal layer.

8. The flexible touch control display screen according to claim 7, wherein the first electrode disposed in the contact holes includes a first sub-electrode; and
    wherein the first sub-electrode is connected to the metal bridge via the contact holes disposed on the metal bridge.

9. The flexible touch control display screen according to claim 6, wherein the second electrode is disposed in the recesses of the first inorganic layer, and the other portion of the second metal layer excluding a portion of the second metal layer in the recesses constitutes the first electrode;
    wherein a pattern of a touch control electrode formed by intersecting the first electrode with the second electrode constitutes a metal grid, and the metal grid is diamond-shaped, triangle-shaped, or quadrilateral-shaped; and
    wherein the first electrode is one of a touch control driving electrode and a touch control sensing electrode, and the second electrode is the other of the touch control driving electrode and the touch control sensing electrode and is different from the first electrode.

10. A method for manufacturing a flexible touch control display screen, comprising: a step S20 of depositing a first metal layer on a film encapsulation layer, and using a first mask to carry out a first masking process for the first metal layer to form a metal bridge on a surface of the film encapsulation layer:

a step S30 of depositing a first inorganic layer on a surface of the metal bridge, wherein the first inorganic layer covers the metal bridge and the film encapsulation layer;

a step S40 of using a second mask to carry out a second masking process for the first inorganic layer to form at least two recesses and at least two contact holes in the first inorganic layer; wherein the recesses include a first recess and a second recess, the contact holes are disposed above two ends of the metal bridge, the first recess is disposed in the first inorganic layer and above the metal bridge, and the second recess is disposed on the film encapsulation layer; and wherein the first recess is positioned between two of the contact holes, and bottoms and sidewalls of the first recess, the second recess, and the contact holes all include the second metal layer;

a step S50 of depositing a second metal layer on a surface of the first inorganic layer, and partially removing the second metal layer to form at least two first electrodes and at least one second electrode intersecting with the first electrodes on the first inorganic layer; and a step S60 of depositing a protective layer on a surface of the second metal layer, wherein the protective layer covers the second metal layer and the first inorganic layer.

11. The method according to claim 10, wherein, before the step S20, the method further comprises:

a step S10 of providing a flexible substrate, and sequentially forming a thin film transistor (TFT) layer, an organic light-emitting diode (OLED) display layer, and the film encapsulation layer on the flexible substrate.

12. The method according to claim 10, wherein the first electrodes disposed in the contact holes includes a first sub-electrode; and wherein the first sub-electrode is connected to the metal bridge via the contact holes disposed on the metal bridge.

13. The method according to claim 10, wherein the second electrode is disposed in the first recess of the first inorganic layer on the metal bridge, and the other portion of the second metal layer excluding a portion of the second metal layer in the first recess constitutes the first electrodes;

wherein a pattern of a touch control electrode formed by intersecting the first electrodes with the second electrode constitutes a metal grid, and the metal grid is diamond-shaped, triangle-shaped, or quadrilateral-shaped; and wherein the first electrode is one of a touch control driving electrode and a touch control sensing electrode, and the second electrode is the other of the touch control driving electrode and the touch control sensing electrode and is different from the first electrode.

14. The method according to claim 10, wherein the step S50 comprises:

a step S51 of depositing the second metal layer on the surface of the first inorganic layer;

a step S52 of removing part of the second metal layer positioned between each of the contact holes and the first recesses; and a step S53 of forming the first electrodes and the second electrode intersecting with each other on the first inorganic layer.

* * * * *

UNITED STATES PATENT AND TRADEMARK OFFICE
CERTIFICATE OF CORRECTION

PATENT NO. : 10,916,600 B2  
APPLICATION NO. : 15/736323  
DATED : February 9, 2021  
INVENTOR(S) : Jian Ye Page 1 of 1

It is certified that error appears in the above-identified patent and that said Letters Patent is hereby corrected as shown below:

On the Title Page

Item (30) Foreign Application Priority Data:  
Delete "Nov. 22, 2017 (CN) ......................... 2017 1 117083" and insert -- Nov. 22, 2017 (CN) ......................... 20171117083.2 --.

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*